United States Patent
Kim

(10) Patent No.: US 6,819,139 B2
(45) Date of Patent: Nov. 16, 2004

(54) SKEW-FREE DUAL RAIL BUS DRIVER

(75) Inventor: Kwang-il Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/613,283

(22) Filed: Jul. 3, 2003

(65) Prior Publication Data

US 2004/0051567 A1 Mar. 18, 2004

(30) Foreign Application Priority Data

Sep. 16, 2002 (KR) .................................... 10-2002-56236

(51) Int. Cl.[7] ........................................ H03K 19/0175
(52) U.S. Cl. .............................. 326/82; 326/86; 326/28
(58) Field of Search ............................. 326/26–28, 63, 326/80, 83, 86, 93, 95

(56) References Cited

U.S. PATENT DOCUMENTS

| | | | | |
|---|---|---|---|---|
| 6,222,404 B1 | * | 4/2001 | Mehta et al. ................ | 327/200 |
| 6,236,240 B1 | * | 5/2001 | Hill .............................. | 326/98 |
| 6,265,923 B1 | * | 7/2001 | Amir et al. .................. | 327/218 |
| 6,404,233 B1 | * | 6/2002 | Blomgren et al. ............ | 326/93 |
| 6,470,060 B1 | * | 10/2002 | Harrison ..................... | 375/374 |

* cited by examiner

*Primary Examiner*—Don Le
(74) *Attorney, Agent, or Firm*—Mills & Onello, LLP

(57) ABSTRACT

A skew-free dual rail bus driver is provided. The dual rail bus driver includes a first driver outputting first dual signals of the same level, and outputting second dual signals of different levels when a level of a clock changes; a decoder receiving the second dual signals and outputting a single signal; a dual signal controller being triggered due to a change in the level of the second dual signals and outputting third dual signals of different levels in response to the single signal at the same time; and a second driver inverting the levels of the third dual signals output from the dual signal controller and outputting fourth dual signals in accordance with a change in the level of the clock. Accordingly, it is possible to obtain dual rail bus driving signals in which skew does not occur. Also, changes in the phases of dual signals are detected and used as a trigger signal input to an edge trigger flip-flop which is a dual signal controller. Also, signals output from the edge trigger flip-flop are used as dual rail bus driving signal, instead of using a clock delayer.

4 Claims, 5 Drawing Sheets

SKEW-FREE DUAL RAIL BUS DRIVER

This application claims the priority of Korean Patent Application No. 2002-56236 filed on Sep. 16, 2002, in the Korean Intellectual Property Office, the contents of which are incorporated herein in its entirety by reference.

BACKGROUND OF THE INVENTION

1. Field of the Invention

The present invention relates to a dual rail bus driver, and more particularly, to a skew-free dual rail bus driver.

2. Description of the Related Art

In general, data, which is carried in a dual rail bus in which precharge and evaluation occur, passes through a decoder or a multiplexer logic and is then fetched by a clock. The fetched data is again transmitted to the dual rail bus. Dual signals input to the decoder or the multiplexer logic are decoded into a single signal, again converted into dual data, and transmitted to an internal dual rail bus. The precharge refers to a case where dual signals passing through the dual rail bus are both at high levels, and the evaluation refers to a case where the level of one of the dual signals changed to a low level because data is carried, as shown in FIG. 1(a) or (b). FIG. 1(a) shows the states of the dual rail bus in which the precharge and evaluation occur, and FIG. 1(b) shows the states of the dual rail bus together.

While the single signal is converted into the dual signals, skew may occur due to a structural difference in delay between the dual signals. After the internal dual rail bus consisting of the precharge and evaluation periods is precharged, a data bus in which data is carried is discharged by malfunctions caused by the skew. Accordingly, the internal dual rail bus may malfunction.

FIG. 2 is a circuit diagram of a conventional dual rail bus driver. FIGS. 3(a) and 3(b) show timing diagrams of signals output from the dual rail bus driver of FIG. 2. Hereinafter, the operation of the conventional dual rail bus driver will be described with reference to FIGS. 2, 3(a), and 3(b).

When two signals pass through a logic 200 and a first driver 210 according to a clock CLK, the two signals are output as dual signals of different levels as shown in the signal of nodes 1 and 2 of FIG. 3(a). The dual signals become a single signal while passing a decoder 220, as shown in the signal of node 3 of FIG. 3(a). Inverter delayers 230 and 240 use the single signal output from the decoder 220 to drive the dual rail bus. After the single signal passes through the inverter delayers 230 and 240, complementary signals, as shown as nodes 4 and 5 of FIG. 3(a), are generated from the inverter delayers 230 and 240. Since the inverter delayers 230 and 240 have different numbers of stages, the signal of node 5 is delayed more than the signal of node 4. In this case, signals of nodes 4 and 5 may be at high levels at the same time. The clock signal CLK input to a clock delayer 250 is sufficiently delayed and becomes a delayed clock CLK_d. If the clock CLK is delayed for more than a predetermined time, both of the complementary signals, which are input to a second driver 260 in response to the delayed clock CLK_D, reach high levels at nodes 6 and 7, i.e., skew occurs.

In contrast, if the clock CLK is insufficiently delayed by the clock delayer 250, signals at nodes 6 and 7 are at low levels as the nodes 6 and 7 shown in FIG. 3(b), thereby causing the occurrence of a "fail" state.

In order to prevent malfunctions of the dual rail bus driver caused by skew or the "fail" state, it is required to further include protective MOSs 260-1 and 260-2 in the conventional dual rail bus driver.

Therefore, skew-free dual rail bus driver is required to prevent discharging of data.

SUMMARY OF THE INVENTION

The present invention provides a dual rail bus driver in which changes in phases of dual signals output from a first driver are detected, the detection result is used as a clock, and an edge trigger flip-flop is triggered according to the clock, thereby generating skew-free dual signals input to a second driver without using inverter delayers adopted by a conventional dual rail bus driver.

According to an aspect of the present invention, there is provided a dual rail bus driver including a first driver outputting first dual signals of the same level, and outputting second dual signals of different levels when a level of a clock changes. A decoder receives the second dual signals and outputs a single signal. A dual signal controller is triggered due to a change in the level of the second dual signals and outputs third dual signals of different levels in response to the single signal at the same time. A second driver inverts the levels of the third dual signals output from the dual signal controller and outputs fourth dual signals in accordance with a change in the level of the clock.

In one embodiment, the dual signal controller includes a phase change detector detecting changes in the phases of the second dual signals and outputting the detection result as an edge signal and an edge trigger flip-flop being triggered by the edge signal and outputting the third dual signals in response to the single signal at the same time.

The edge trigger flip-flop can be a flip-flop of a sense amplifier type.

In one embodiment, the second driver is implemented without protective MOS devices.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 4:
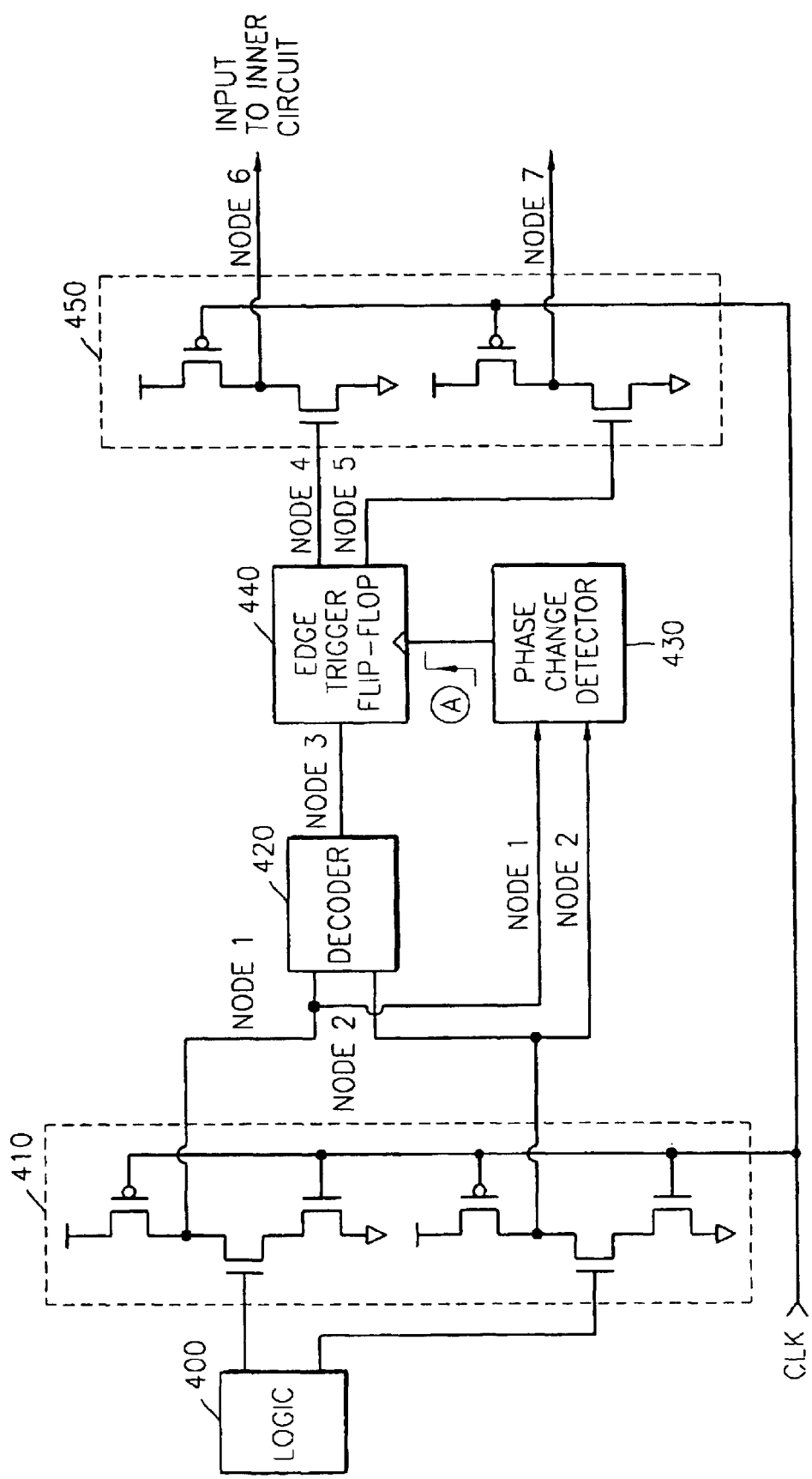
FIG. 4 is a circuit diagram of a dual rail bus driver according to an embodiment of the present invention.

FIG. 4 is a circuit diagram of a dual rail bus driver according to an embodiment of the present invention. Referring to FIG. 4, the dual rail bus driver includes a logic 400, a first driver 410, a decoder 420, an edge trigger flip-flop 440, a phase change detector 430, and a second driver 450.

In the operations of the dual rail bus driver of FIG. 4, the logic 400 outputs dual signals of different levels. The first driver 410 outputs dual signals at nodes 1 and 2 in a high-level precharge state when a clock CLK is at a low level. As the clock CLK is changed to a high level from the low level, the first driver 410 inverts the dual signals output from the logic 400 and outputs the inverted dual signals in the evaluation state. The decoder 420 converts the dual signals output from the first driver 410 into a single signal. Any circuit that can convert two input signals into a single signal is available as the decoder 420. For instance, the decoder 420 may be a logic operation unit such as a NOR gate.

The phase change detector 430 and the edge trigger flip-flop 440 serve as dual signal controllers that receive a single signal output from the decoder 420 and output the single signal as skew-free dual signals. That is, the phase change detector 430 detects phase changes of signals at nodes 1 and 2 and outputs the detection result as an edge signal. A general phase change detector can be used as the phase change detector 430. For instance, the phase change detector 430 may be a logic operation unit.

Figure 6:
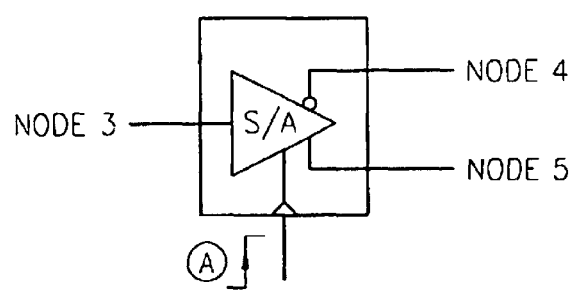
FIG. 6 is a circuit diagram of a sense amplifier.

The edge trigger flip-flop 440 uses the edge signal output from the phase change detector 430 as a trigger signal, and generates skew-free dual signals, which are to be input to the second driver 450, from the single signal output from the decoder 420. Preferably, the edge trigger flip-flop 440 is a flip-flop of a general sense amplifier type as shown in FIG. 6. The sense amplifier flip-flop shown in FIG. 6 outputs dual signals of opposite levels at the same time in response to an input signal according to the trigger signal.

Figure 1:
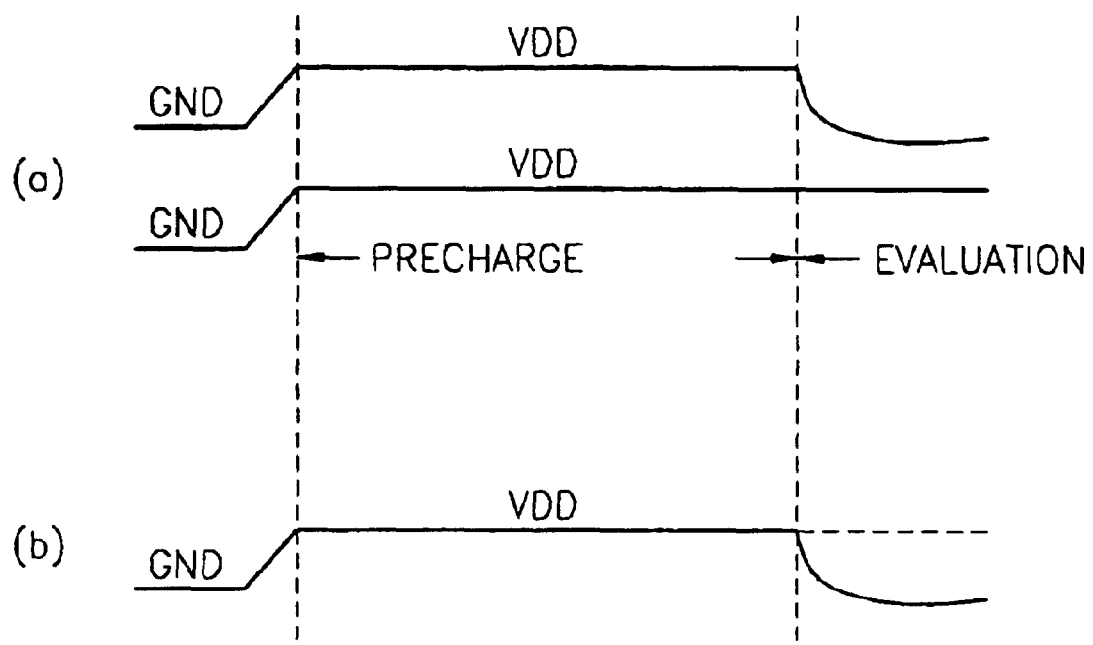
FIG. 1 illustrates a dual rail bus driver in which skew and evaluation states occur.
Figure 2:
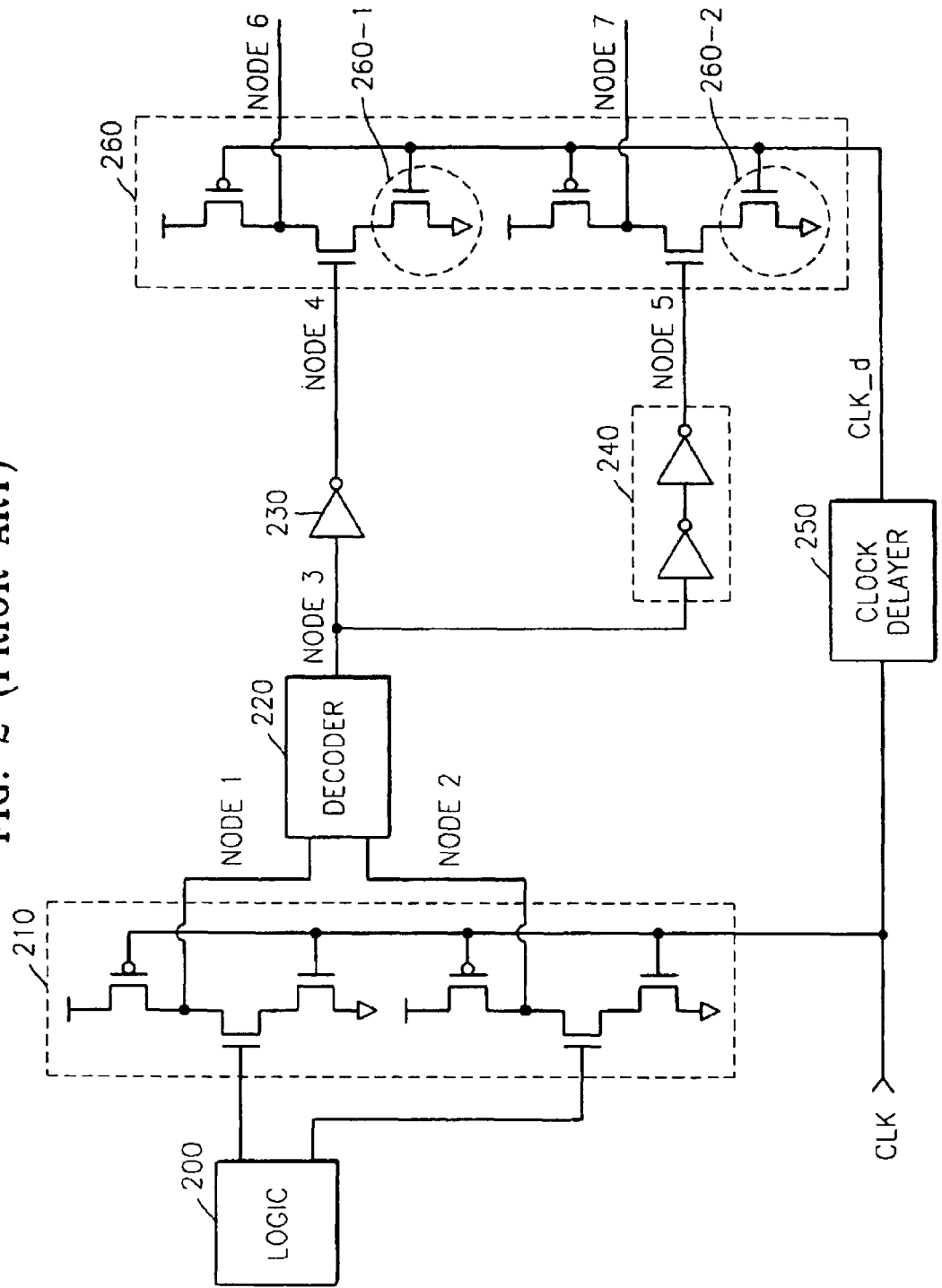
FIG. 2 is a circuit diagram of a conventional dual rail bus driver.
Figure 3:
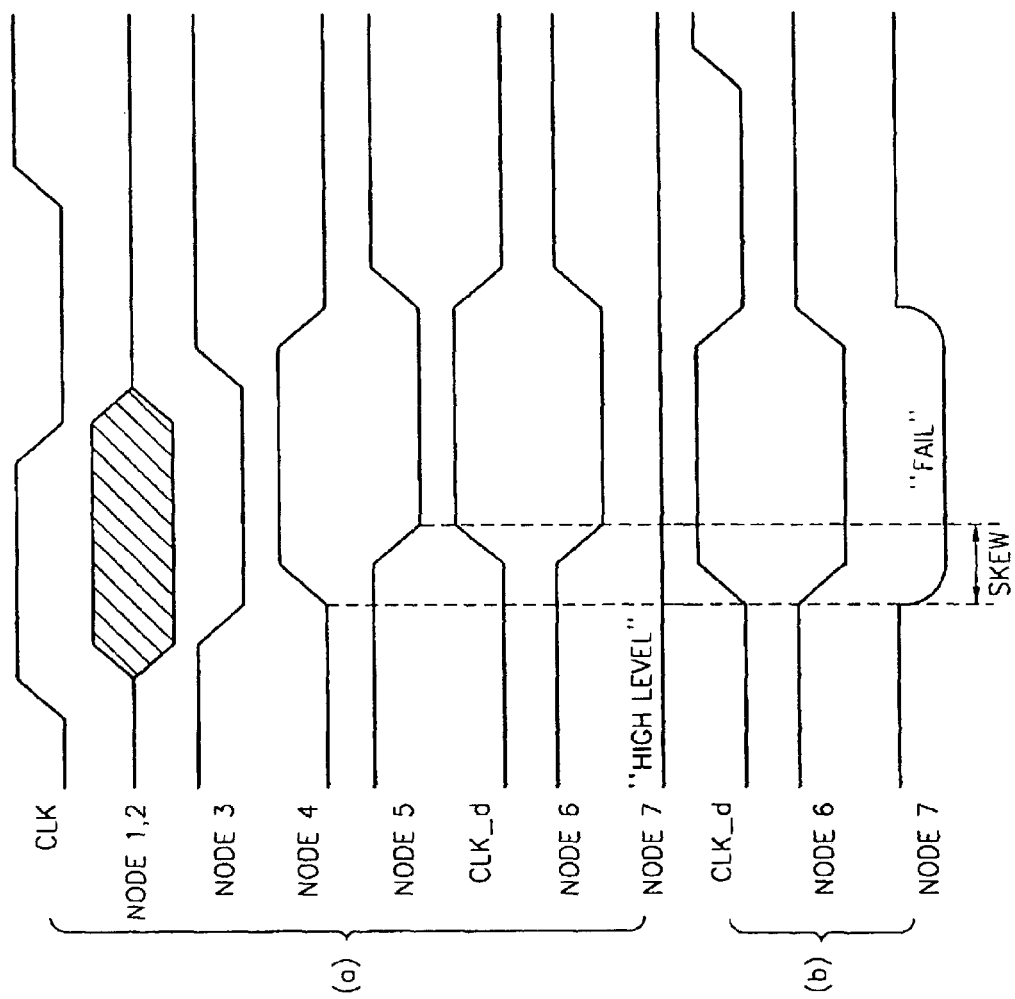
FIG. 3 shows timing diagrams of signals in the dual rail bus driver of FIG. 2.

When the level of the clock CLK changes from a low level to a high level, the second driver 450 inverts the input dual signals and outputs skew-free data. As shown in FIG. 4, the second driver 450 does not need protective MOSs which are adopted by a conventional dual rail bus driver (referred to as items 260-1 and 260-2 in FIG. 2). That is, according to the present invention, the edge trigger flip-flop 440 outputs skew-free signals. Therefore, the edge trigger flip-flop 440 is not required to further include protective MOSs to prevent failure and/or malfunctions of the second driver 450 caused by the occurrence of the skew.

Figure 5:
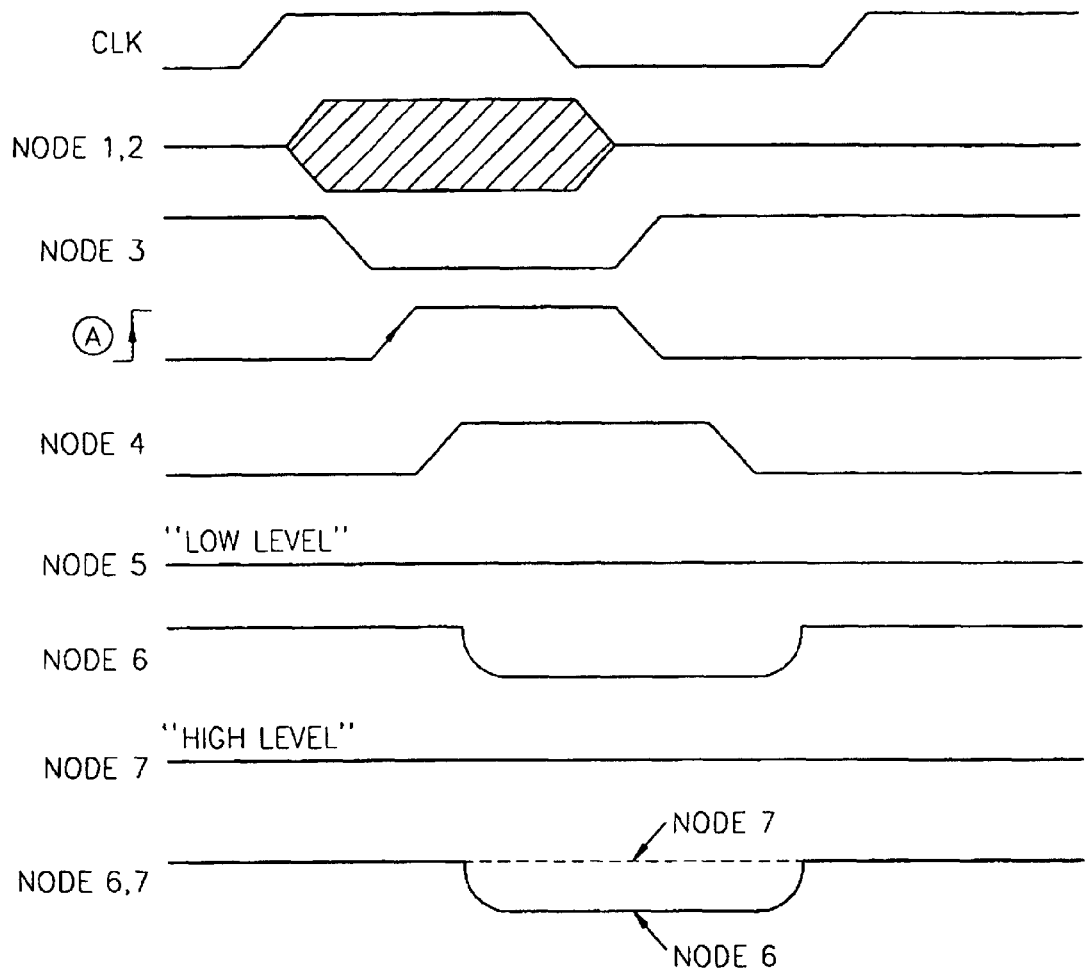
FIG. 5 shows timing diagrams of signals in the dual rail bus driver of FIG. 4.

FIG. 5 shows timing diagrams of signals in the dual rail bus driver of FIG. 4. Hereinafter, the operation of the dual rail bus driver according to the present invention will be described with reference to FIGS. 4 and 5.

Dual signals output from the first driver 400 are at high level, i.e., at the precharge state, at nodes 1 and 2 when the clock CLK is at a low level. Then, as the clock CLK is changed from the low level to a high level, the dual signals are inverted and output as shown as nodes 1 and 2 of FIG. 5. When the signals of nodes 1 and 2 are input to the decoder 420, a single signal at node 3 as shown in FIG. 5 is output.

The phase change detector 430 receives the dual signals of nodes 1 and 2 and outputs an edge signal, which is indicated as "A" in FIG. 6, when the phases of the dual signals change. The edge trigger flip-flop 440 is triggered by the edge signal A to output skew-free dual signals at nodes 4 and 5 of FIG. 5 in response to an input signal of node 3 of FIG. 5. The second driver 450 is in a precharge state when the clock CLK is at a low level, and inverts the dual signals of nodes 4 and 5 of FIG. 5 and outputs these signals as shown at nodes 6 and 7 of FIG. 5.

As described above, skew-free dual rail bus driving signals are generated using a dual rail bus driver according to the present invention. Also, according to the present invention, changes in the phases of dual signals output from a first driver are detected, the detection result is used as a trigger signal input to an edge trigger flip-flop, and signals output from the edge trigger flip-flop are used as the dual rail bus driving signals. Accordingly, a clock delayer is not additionally required.

Further, a second driver does not need to include protective MOS devices to prevent failure and/or malfunctions of the dual rail bus driver due to skew occurring when generating a driving signal, thereby increasing the driving speed of the dual rail bus driver.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A dual rail bus driver comprising:
    a first driver outputting first dual signals of the same level, and outputting second dual signals of different levels when a level of a clock changes;
    a decoder receiving the second dual signals and outputting a single signal;
    a dual signal controller being triggered due to a change in the level of the second dual signals and outputting third dual signals of different levels in response to the single signal at the same time; and
    a second driver inverting the levels of the third dual signals output from the dual signal controller and outputting fourth dual signals in accordance with a change in the level of the clock.

2. The dual rail bus driver of claim 1, wherein the dual signal controller comprises:
    a phase change detector detecting changes in the phases of the second dual signals and outputting the detection result as an edge signal; and
    an edge trigger flip-flop being triggered by the edge signal and outputting the third dual signals in response to the single signal at the same time.

3. The dual rail bus driver of claim 2, wherein the edge trigger flip-flop is a flip-flop of a sense amplifier type.

4. The dual rail bus driver of claim 1, wherein the second driver is implemented without protective MOS devices.

* * * * *